United States Patent
Fischer et al.

(12)

(10) Patent No.: US 7,327,152 B2
(45) Date of Patent: Feb. 5, 2008

(54) INTEGRATED TEST CIRCUIT ARRANGEMENT AND TEST METHOD

(75) Inventors: Armin Fischer, München (DE); Alexander von Glasow, Grünwald (DE)

(73) Assignee: Infineon Technologies, AG, Munich (DE)

( * ) Notice: Subject to any disclaimer, the term of this patent is extended or adjusted under 35 U.S.C. 154(b) by 131 days.

(21) Appl. No.: 10/529,340

(22) PCT Filed: Sep. 19, 2003

(86) PCT No.: PCT/DE03/03129

§ 371 (c)(1),
(2), (4) Date: Mar. 24, 2005

(87) PCT Pub. No.: WO2004/031787

PCT Pub. Date: Apr. 15, 2004

(65) Prior Publication Data

US 2005/0274989 A1    Dec. 15, 2005

(30) Foreign Application Priority Data

Sep. 27, 2002 (DE) ................................ 102 45 152

(51) Int. Cl.
*G01R 31/02* (2006.01)

(52) U.S. Cl. ................................ 324/763

(58) Field of Classification Search ............ None
See application file for complete search history.

(56) References Cited

U.S. PATENT DOCUMENTS 4,684,884 A    8/1987    Soderlund (Continued)

FOREIGN PATENT DOCUMENTS

DE    1996 12 441 A1    10/1997

(Continued)

OTHER PUBLICATIONS

Yervant Zorian, Ad J. Van de Goor and Ivo Schanstra, *An Effective BIST Scheme for Ring-Address Type FIFOs*, pp. 378-387, IEEE, Paper 17.2, International Test Conference 1994.

(Continued)

*Primary Examiner*—Jermele Hollington
(74) *Attorney, Agent, or Firm*—Brinks Hofer Gilson & Lione

(57) ABSTRACT

An integrated test circuit arrangement is provided that contains integrated test structures, at least one integrated heating element, an integrated detection unit, an integrated supply unit, and a control unit. The integrated detection unit detects at least one physical property for each of the test structures. The integrated supply unit supplies each of the test structures with a current or a voltage in switchable fashion independently of one another. The control unit is connected to outputs of the detection unit on an input side and controls the supply unit dependent on the detection results.

21 Claims, 2 Drawing Sheets

U.S. PATENT DOCUMENTS

| | | | |
|---|---|---|---|
| 5,625,288 A * | 4/1997 | Snyder et al. | 324/158.1 |
| 5,706,293 A | 1/1998 | Kim et al. | |
| 5,898,706 A | 4/1999 | Dufresne et al. | |
| 6,060,895 A | 5/2000 | Soh et al. | |
| 6,121,576 A * | 9/2000 | Hembree et al. | 324/765 |
| 6,157,046 A | 12/2000 | Corbett et al. | |
| 6,191,595 B1 * | 2/2001 | Wohlfarth et al. | 324/754 |
| 6,293,698 B1 | 9/2001 | Alvis | |
| 6,313,653 B1 * | 11/2001 | Takahashi et al. | 324/760 |
| 6,392,432 B1 * | 5/2002 | Jaimsomporn et al. | 324/760 |
| 6,614,003 B2 * | 9/2003 | Hembree et al. | 324/765 |
| 6,747,471 B1 * | 6/2004 | Chen et al. | 324/765 |
| 6,774,653 B2 * | 8/2004 | Gold et al. | 324/760 |
| 7,061,264 B2 * | 6/2006 | Kang et al. | 324/765 |
| 7,112,952 B2 * | 9/2006 | Arai et al. | 324/158.1 |

FOREIGN PATENT DOCUMENTS

EP    1 241 678 A2    9/2002

OTHER PUBLICATIONS

International Search Report from corresponding PCT application No. PCT/DE03/03126.

Examination Report from corresponding PCT application No. PCT/DE03/03126.

* cited by examiner

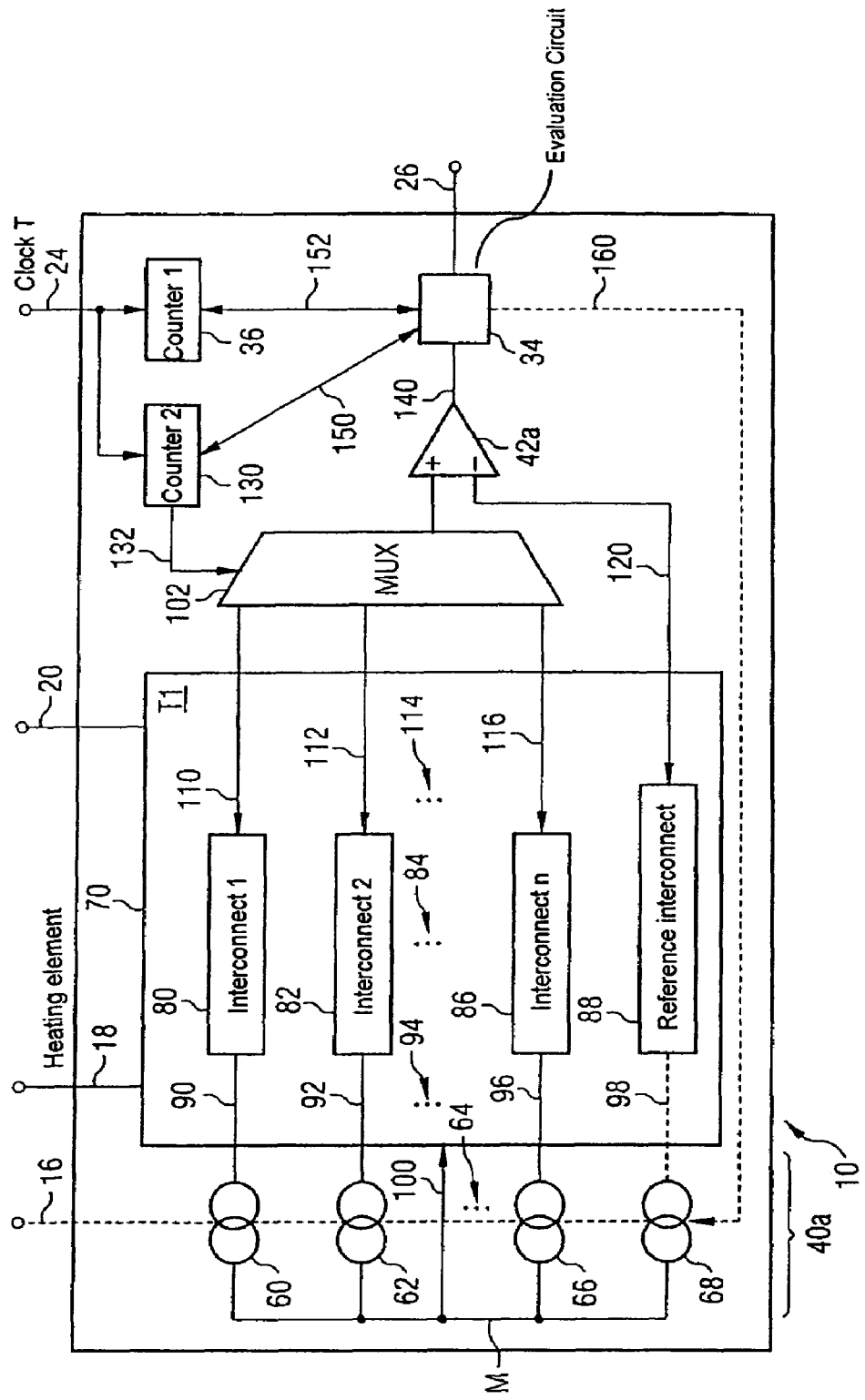

INTEGRATED TEST CIRCUIT ARRANGEMENT AND TEST METHOD

BACKGROUND

This application is the national stage application of international application number PCT/DE03/003129, filed on Sep. 19, 2003, which claims the benefit of priority to German Patent Application 102 45 152.4, filed on Sep. 27, 2002, incorporated herein by reference.

The invention relates to an integrated test circuit arrangement containing a multiplicity of test structures.

SUMMARY

Test structures that are subjected to reliability tests, by way of example, are or contain inter alia dielectrics, metallizations or electronic components, in particular integrated components. In order to accelerate the test, it is possible, on the one hand, to use for example higher temperatures, higher currents and/or higher voltages during testing and during normal operation of the arrangement to be tested. On the other hand, it is possible to achieve for example acceptably short test durations by the structures to be tested not being tested until failure, but rather only until a specific limit value is reached.

It is an object of the invention to specify, for testing electronic test structures, a circuit arrangement constructed in a simple manner which, in particular, enables testing in an environment that is as simple as possible and with the fewest possible interventions by operating personnel. Moreover, the intention is to specify a test method.

The invention is based on the consideration that it is possible to integrate many of the devices required for a reliability test in the test circuit arrangement, so that these devices do not have to be separately procured, maintained and operated.

Therefore, the test circuit arrangement according to the invention contains, besides the test structures, at least one heating element and/or at least one detection unit and/or at least one supply unit. The heating element serves for heating the test structures to a temperature required for the reliability test, which temperature is usually considerably greater than the room temperature of the room in which the test is carried out. For each test structure, the detection unit detects a physical quantity established on account of the heating and, if appropriate, on account of additional measures at the test structure, for example the resistance thereof or the leakage current thereof.

The use of the test circuit arrangement with an integrated heating element makes it possible to carry out the reliability tests without using a thermal cabinet. It would be necessary to fix the devices with the test structures on circuit boards into the thermal cabinet and load them in each case by a dedicated current or voltage source. Such thermal cabinets would only be required in small numbers, and so they would be very expensive to produce. At test temperatures of, for example, greater than two hundred degrees Celsius or even greater than three hundred degrees Celsius, it would be necessary to satisfy particular requirements made of a stable contact between the device, the circuit board or between the circuit board and the connections. This would result in very expensive circuit boards which, moreover, would only have a very limited service life at the test temperatures mentioned, for example of just a thousand test hours.

In one development of the circuit arrangement according to the invention, test structures of a group have the same construction. The same construction is the basis for a reliable comparison result. By way of example, all the test structures of a group comprise:
  interconnects which preferably comprise a metal, and/or which are in each case led into another metallization layer or metallization plane by means of at least one via or contact hole which particularly influences the reliability,
  dielectric layers to which a test voltage is applied, or
  electronic components, e.g. active electronic components such as transistors or passive electronic components such as capacitors, resistors or coils.

In another development, test structures of different groups are integrated into the test circuit arrangement, for example a group with via interconnects, a group with dielectrics and a group with active electronic components. Separate thermal cabinets would be required for the tests of such different groups since different test requirements exist.

In a next development with a test circuit arrangement containing different groups of test structures, the test structures of different groups are integrated spatially, i.e. in different planes parallel to the plane of a carrier substrate for the test structures. These measures enable a multiplicity of test structures to be arranged and tested even when the integrated circuit arrangement has a very small area. By way of example, so-called via 1 structures could be arranged below so-called MIM capacitor structures (Metal Insulator Metal).

In a next development, a group of test structures contains more than fifty, more than one hundred or even more than a thousand test structures. The statistical meaningfulness of the test results increases considerably as the number of test structures increases. Very many test structures can be integrated into the test circuit arrangement without a high additional outlay in terms of process engineering. The test of these structures likewise requires no or at any rate only comparatively little additional outlay.

In a next development of the circuit arrangement according to the invention, the heating element is a resistance heating element which preferably comprises polycrystalline silicon. In order to set the conductivity of the polycrystalline silicon, it is doped. However, other developments also make use of heating elements which comprise a metal. If the heating element is fed with AC current, then it is possible to prevent or considerably reduce degradation processes, e.g. electromigration in particular in heating elements made of metal.

In one development, a supply unit is also integrated into the test circuit arrangement. The supply unit contains for example a multiplicity of voltage sources or of current sources. In one configuration, the supply unit supplies the test structures with a current or a voltage independently of one another. An independent supply makes it possible to terminate the test of one test structure despite continuing a test at other identically constructed test structures of the circuit arrangement before the test structure fails. In addition, the material is available after the conclusion of the test for material examinations in a state at which a failure criterion was just fulfilled.

In a next development, the heating element has a straight profile or a meandering profile. Heating elements with a triangular function profile, i.e. a zigzag profile, or with a rectangular function profile are also used.

In another development, the supply unit contains a plurality of current sources or a plurality of voltage sources. In particular current sources containing a plurality of current mirrors can be integrated in a particularly simple manner. On the basis of the choice of the areas of the transistors contained in a current mirror, currents which are a multiple or a faction of a reference current, for example an integral multiple or a faction of integral values, can be generated in a particularly simple manner.

In a next development, the detection unit is connected to each test structure or can be connected to each test structure. The detection unit contains at least one counter unit, which is clocked in accordance with a predetermined clock. A detection unit constructed in this way can detect physical properties at individual test structures and determine the detection instant with the aid of the counter unit. By way of example, the counter unit could be an electronic clock.

In another development, the detection unit contains at least one multiplex unit, the inputs of which are electrically connected to a respective test structure. The use of a multiplex unit makes it possible to utilize assemblies of the detection unit successively for a plurality of test structures. Thus, in a next development, the output of the multiplex unit is connected to the input of a comparison unit, the input of which is electrically connected to a reference structure. The reference structure has for example a different construction and/or different dimensions than the test structure. What is achieved by means of this development is that a multiplicity of test structures can be tested with a comparison unit. The error or failure criterion of a test structure is predefined by the reference structure.

In a next development, the circuit arrangement contains a control unit, which is connected to the outputs of the detection unit on the input side. The control unit for example outputs detection results and/or drives the supply unit in a manner dependent on the detection results. By way of example, if the failure criterion is generated by a test structure, then the current source or the voltage source for this test structure is switched off. This measure ensures that the test structure can be examined later with the aid of material examining methods, the state when meeting the failure criterion being preserved.

In another development, the control unit additionally outputs a datum for ascertaining the detection time and a datum for identifying a specific test structure in a manner dependent on a detection result for this test structure. When the data are in a fixedly predefined order, identifiers for the test structures are not absolutely necessary because the position of a test datum in the order specifies the test structure associated with this test datum. What is thus achieved through the use of the control unit is that the circuit arrangement can output a set of results for all the test structures examined in digital form. As a result, the tests can be carried out with low complexity, cost-effectively and for large numbers. The area of the integrated circuit arrangement that is required for the control unit and for the detection unit is more than compensated for by the saving of a multiplicity of connection pads.

In another development, the circuit arrangement contains a substrate, for example made of a semiconductor, in particular made of silicon. The test structures, the heating element, the detection unit and, if appropriate, also the supply unit and/or the control unit are arranged in the substrate or in a manner mechanically fixed to the substrate. To put it another way, the individual parts of the circuit arrangement cannot be released from the substrate without said circuit arrangement being destroyed, in particular not by means of mechanical tools or manually, as would be the case with thermal cabinets.

In a next development, the test circuit arrangement is arranged in a plastic housing or in a ceramic housing. On account of the integration of the heating element, plastic housings can still be used even at temperatures of above two hundred degrees Celsius.

The invention additionally relates to a test method for testing test structures, in which the following steps are implemented without limitation by the order specified:
  integration of test structures into an integrated circuit arrangement,
  integration of at least one detection unit and/or a supply unit into the integrated circuit arrangement,
  connection of the test structures to the supply unit,
  detection in each case of at least one physical property of the test structures by means of the detection unit.

The use of an integrated heating element makes it possible, in one development or in another aspect, for example to implement reliability tests without using a complex test apparatus, for example without using a thermal cabinet.

In another development, the heating element is heated to temperatures of greater than two hundred degrees Celsius or greater than three hundred degrees Celsius. Despite these high temperatures, only a low heating power is required because only the volume occupied by the circuit arrangement or even only a part of said volume has to be heated, but not the comparatively large volume of a heating cabinet.

In another development, output electronics integrated into the integrated circuit arrangement output a set of result data for all the test structures. The outputting of a set of result data with a predefined data structure gives rise to an interface that permits operation of the test circuit arrangement independently of units for the complete evaluation of the result data.

BRIEF DESCRIPTION OF THE DRAWINGS

Exemplary embodiments of the invention are explained below with reference to the accompanying drawings, in which:

FIG. 2 shows a basic illustration of the inter-connection of functional units for the test of a group of test structures.

DETAILED DESCRIPTION

Figure 1:
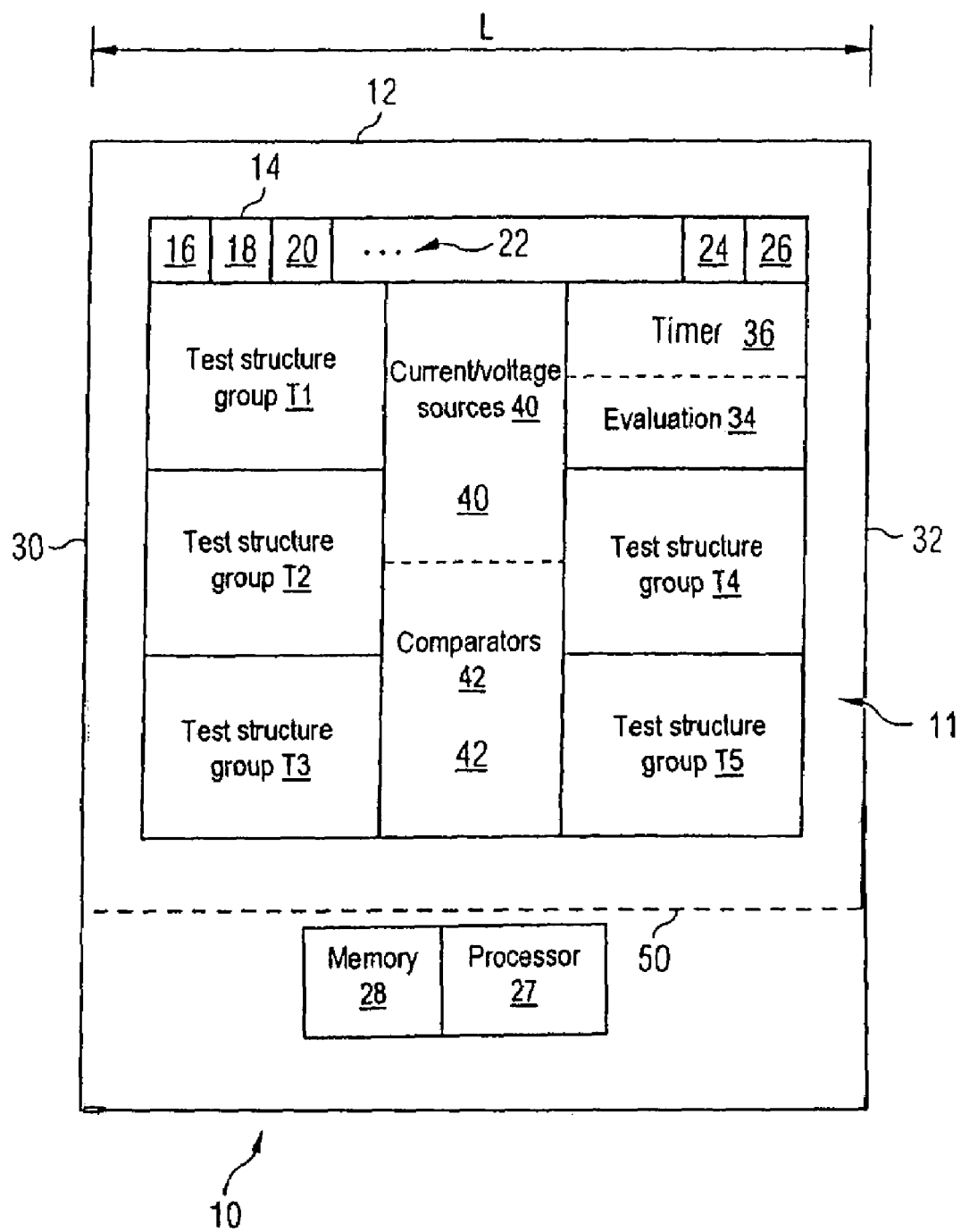
FIG. 1 shows the division of the area of an integrated test circuit arrangement between different functional units.

FIG. 1 shows an integrated test circuit arrangement 10 arranged on a substrate 11 for example on a square silicon chip having edge lengths L that are smaller than ten millimeters. A connection region 14 containing a plurality of connections 16 to 26 that are electrically insulated from one another is arranged along an edge 12. The function of the connections 16 to 26 is explained in more detail below with reference to FIG. 2.

Three test structure groups T1 to T3 extend along an edge 30 of the circuit arrangement 10 that adjoins the edge 12. Two further test structure groups T4 and T5 are situated along an edge 32 opposite the edge 30. The test structure groups T1 to T5 occupy approximately identical areas in the exemplary embodiment. The test structure group T1 contains metallic via interconnects, by way of example. The test structure group T2 contains dielectrics by way of example.

An evaluation circuit 34 and a timer unit 36, the functions of which is explained in more detail below with reference to FIG. 2, are additionally situated between the test structure group T4 and the connection region 14. Moreover, in the integrated circuit arrangement 10, there are additionally a multiplicity of current sources and voltage sources 40 and a plurality of comparators 42 in a central region between the test structure groups T1 to T3, on the one hand, and the test structure groups T4 and T5, on the other hand. The voltage sources are required for the test of the dielectrics, by way of example. In another exemplary embodiment, only current sources 40 or only voltage sources 40 are utilized.

In the exemplary embodiment explained, there are no further assemblies situated in the circuit arrangement 10, in particular no user circuits besides the test circuit.

In another exemplary embodiment, by contrast, the circuit arrangement 10 contains components of a user circuit, see dashed line 50. The user circuit is for example a memory unit 28 having several million memory cells or a processor 27. In this exemplary embodiment, the reliability tests are carried out on structures that have been fabricated by means of the same processes as identical structures in the user circuit. With such an integrated circuit, ongoing production can be monitored in the manner of random sampling or in its entirety in a very reliable manner.

FIG. 2 shows a basic illustration of the combination of functional units of the integrated circuit arrangement 10. These functional units include a multiplicity of current sources 60 to 68, which form a part of the current/voltage sources 40.

A heating element 70 lies below test interconnects 80 to 86 having the same construction and below a reference interconnect 88, which has the same construction as the test interconnects 80 to 86 but is twenty percent longer than the interconnects 80 to 86. The test interconnects 80 to 86 form the test structures of the test structure group T1. There are connecting interconnects 90 to 98 in each case between the current sources 60 to 68 at one end and the test interconnects 80 to 86 and also the reference interconnect 88 at the other end. The connecting interconnect 98 is shown dashed in FIG. 2 since the current source 68 feeds a current into the reference interconnect 88 during the test only when the reference interconnect 88 is used for a comparison with one of the test interconnects 80 to 86.

At the other end the current sources 60 to 68 are also connected to a ground line M which leads, with the interposition of a resistor, by way of example, to the other ends of the test interconnects 80 to 86 and to the other end of the reference interconnect 88, see arrow 100.

The current sources 60 to 68 are realized with the aid of current mirrors which duplicate a reference current impressed via the connection 16. In addition, the current sources 60 to 68, as explained in more detail below, can be individually switched on and switched off.

The heating element 70 is supplied with an AC current, by way of example, via the connections 18 and 20. A resistance contained in the heating element 70 has a meandering profile.

The ends of the interconnects 80 to 86 which are not connected to the current sources 60 to 68 are connected to the inputs of a multiplexer 102. By way of example, the multiplexer 102 has two hundred input lines 110 to 116. The output of the multiplexer 102 is connected to the noninverting input of a comparator 42a that is associated with the comparators 42. The inverting input of the comparator 42a is connected to that end of the reference interconnect 88 which is not connected to the current source 68, see arrow 120.

The control inputs of the multiplexer 102 are connected to the outputs of a counting unit 130. The counting unit 130 counts for example cyclically from one to two hundred, see arrow 132.

The output of the comparator 42a leads to the evaluation circuit 34, see connecting interconnect 140. The output of the evaluation circuit 34 is connected to the connection 26. The evaluation circuit 34 accesses the counter value of the counting unit 130 and the timer unit 86, which is realized by a further counter in the exemplary embodiment, see arrows 150 and 152. An arrow 160 symbolizes the control function of the evaluation circuit 34 with regard to the current sources 60 to 68.

The timer unit 36 and the counter unit 130 are clocked by a clock T present at the connection 24. By way of example, the clock T has a clock period of ten milliseconds.

In order to test the interconnects 80 to 86 for reliability or in order to determine the life time, for example with regard to electromigration, at the beginning of the test the current sources 60 to 66 are switched on, so that they in each case feed a constant current into the test interconnects 80 to 86. An AC voltage is applied to the heating element 70 and then a constant temperature of two hundred and fifty degrees Celsius, for example, is generated at the test interconnects 80 to 86 and also at the reference interconnect 88 with the aid of a temperature regulating circuit. With each clock pulse of the clock T, the counter value of the counter unit 130 is incremented by the value one. As a result, a voltage is successively tapped off at the interconnects 80 to 86 and compared with the voltage tapped off at the reference interconnect 88 in the comparator 42a. In order to restrict the electromigration in the reference interconnect 88, the constant-current source 68 is switched off again between the individual comparisons.

As soon as a voltage signal that signals an identical voltage value at both inputs of the comparator 42a or a larger voltage value at the noninverting input of the comparator 42a occurs at the output of the comparator 42a or on the connecting line 140, the evaluating circuit 34 reads the counter reading in the counter unit 130. Said counter reading indicates that test interconnect 80 to 86 at which a voltage is currently being tapped off. The counter reading that has been read is recorded in a memory unit (not illustrated) of the evaluation circuit or gives serves for determining a memory location for storing a result datum. In addition, the evaluation circuit 34 accesses the counter value of the timer circuit 36. The value is read and stored together with the counter value of the counter unit 130 in the memory unit or at the memory location determined. The counter value of the timer unit 36 indicates the detection instant at which the voltage was tapped off at the relevant interconnect 80 to 86. As an alternative, the detection instant can be determined with the aid of the counter value of the timer unit 36.

In addition, in the case where the voltages at the input of the comparator 42a are identical, the evaluation circuit 34 causes that current source 60 to 66 to be switched off which leads to an interconnect 80 to 86 at which a voltage is currently being tapped off. As a result, a multiple recording of counter readings for a test interconnect 80 to 86 is also avoided. By way of example, the counter reading of the counter unit 130 can again be used for determining the interconnect 80 to 86.

If all the current sources 60 to 66 have been switched off successively or if a predefined value has been reached in the timer unit 36, then the evaluation unit 34 outputs a set of detection data at the connection 26. By way of example, a data processing system is connected to the connection 26 and is used to represent the detection data on a display unit. The data can also be stored with the aid of the data processing system for later evaluations.

In another exemplary embodiment, just a single counter is used in place of the timer unit 36 and the counter unit 130. The most significant digits of the counter value are passed to the multiplexer 102 via a data bus, see arrow 132. In this way, the inputs of the multiplexer 102 that lead to the interconnects 80 to 86 are again cyclically connected to the output of the multiplexer 102. The evaluation circuit 34 needs to read only one counter value in this case. It is possible to determine from this counter value both the detection time and that of the test interconnect 80 to 86 at which a voltage was tapped off at the detection instant.

If, as explained in the exemplary embodiment, the reference interconnect has a length that is twenty percent greater than the length of the test interconnects 80 to 86, then the nonreactive resistance of the reference interconnect 88 is also twenty percent greater than the nonreactive resistance of an inter-connect 80 to 86. The failure criterion predefined by the reference interconnect 88 consists in terminating the test of a test interconnect 80 to 86 if the resistance of a test interconnect 80 to 86 has increased by twenty percent. This means in other words that the change dR in the resistance R of an interconnect 80 amounts to twenty percent of the original resistance R at the start of the test, i.e. dR/R=20%. Other values for the failure criterion or else other failure criteria can be predefined in an analogous way.

The invention claimed is:

1. An integrated test circuit arrangement
having integrated test structures located on an integrated circuit substrate,
at least one integrated heating element located on the integrated circuit substrate,
an integrated detection unit, located on the integrated circuit substrate, which detects at least one physical property for each of the test structures,
an integrated supply unit, located on the integrated circuit substrate, which supplies each of the test structures with a current or a voltage in switchable fashion independently of one another, and
a control unit which is connected to outputs of the detection unit on an input side and which controls the supply unit dependent on the detection results;
wherein at least one of:
the detection unit contains at least one multiplexer unit, the inputs of which are electrically connected to a respective test structure, and
an output of the multiplexer unit is connected to a first input of a comparison unit, a second input of which is electrically connected to a reference structure, the reference structure having at least one of a different construction and different dimensions than the test structures.

2. The circuit arrangement as claimed in claim 1, wherein the test structures of a first group have the same construction among one another.

3. The circuit arrangement as claimed in claim 1, wherein at least one of:
the supply unit contains at least one of: a multiplicity of integrated current sources and a multiplicity of integrated voltage sources, and
the current sources contain a plurality of current mirrors which each generate a multiple or a fraction of a reference current or a current having the magnitude of the reference current.

4. The circuit arrangement as claimed in claim 1, wherein the heating element at least one of:
contains a resistance heating element which comprises monocrystalline silicon or polycrystalline silicon or which comprises a metal, and
has a straight profile, a meandering profile, a triangular function profile or a rectangular function profile.

5. The circuit arrangement as claimed in claim 1, further comprising at least one reference structure, at least one of the construction and the dimensions of which differ from the construction and the dimensions of the test structures.

6. The circuit arrangement as claimed in claim 1, wherein the detection unit at least one of:
is connected or can be connected to the test structures, and
contains at least one counter unit, which is clocked in accordance with a predetermined clock.

7. The circuit arrangement as claimed in claim 1, wherein the control unit outputs at least one of: detection results, a datum for ascertaining the detection instant and a datum for identifying the test structures.

8. The circuit arrangement as claimed in claim 1, further comprising electronic components associated with a user circuit.

9. The circuit arrangement as claimed in claim 1, wherein the circuit arrangement is encapsulated in a plastic housing or in a ceramic housing.

10. The circuit arrangement as claimed in claim 1, wherein:
the test structures of a second group contain interconnects which at least one of: comprise a metal or are led into another metallization layer by means of a via,
the test structures of a third group contain dielectrics, or
the test structures of a fourth group contain active or passive electronic components.

11. The circuit arrangement as claimed in claim 8, wherein the electronic components comprise at least one of a memory unit and a processor.

12. A method for testing test structures, the method comprising the following steps that are implemented without limitation by the order specified:
integrating test structures into an integrated circuit arrangement,
integrating a detection unit into the integrated circuit arrangement, the detection unit detecting at least one physical property of the test structures,
integrating at least a part of a supply unit into the integrated circuit arrangement,
connecting the test structures to the supply unit,
detecting one of the physical properties of each of the test structures by means of the detection unit, and
integrating a control unit into the integrated circuit arrangement, which is connected to outputs of the detection unit on an input side and which controls the supply unit dependent on the detection results;
wherein at least one of:
the detection unit contains at least one multiplexer unit, the inputs of which are electrically connected to a respective test structure, and
an output of the multiplexer unit is connected to a first input of a comparison unit, a second input of which is electrically connected to a reference structure, the reference structure having at least one of a different construction and different dimensions than the test structures.

13. The method as claimed in claim 12, further comprising at least one of the following steps:
integrating at least one heating element into the integrated circuit arrangement,
warming or heating the test structures with the aid of the heating element, and
connecting the supply unit to the test structure during warming or during heating.

14. The method as claimed in claim 12 further comprising the following steps:

integrating at least one reference structure, at least one of the construction and the dimensions of which differ from the construction and the dimensions of the test structures, detecting one of the physical reference properties at the reference structure, comparing the one of the physical properties with a reference property or comparing a quantity generated from the one of the physical properties and a quantity generated from the reference property.

15. The method as claimed in claim 12, wherein the same physical properties of different test structures are successively compared with a reference property.

16. The method as claimed in claim 13, wherein the heating element is at least one of:

fed with at least one of an AC current and a DC current, and heated to temperatures of greater than two hundred degrees Celsius.

17. The method as claimed in claim 12, wherein an output circuit is integrated into the integrated circuit arrangement, the output circuit outputs at least one set of detection data for the test structures.

18. The method as claimed in claim 12, wherein the method is implemented at least one of:

with an unencapsulated integrated circuit arrangement, with an integrated circuit arrangement that is still arranged on a semiconductor wafer, the semiconductor wafer carrying a multiplicity of other integrated circuit arrangements, and for the purpose of monitoring ongoing production.

19. The method as claimed in claim 12, further comprising integrating at least a part of the supply unit into the integrated circuit arrangement, said part containing at least one active component.

20. The method as claimed in claim 14, further comprising registering an instant at which the comparison result changes.

21. An integrated test circuit arrangement having integrated test structures, and having at least one of the following elements or units:

at least one integrated heating element;

and/or an integrated detection unit, which detects at least one physical property in each case for the test structures;

and/or having an integrated supply unit, which supplies the test structures with a current or a voltage in each case in switchable fashion independently of one another;

wherein at least one of the detection unit contains at least one multiplexer unit, the inputs of which are electrically connected to a respective test structure, and an output of the multiplexer unit is connected to a first input of a comparison unit, a second input of which is electrically connected to a reference structure, the reference structure having at least one of a different construction and different dimensions than the test structures.

* * * * *

UNITED STATES PATENT AND TRADEMARK OFFICE
CERTIFICATE OF CORRECTION

PATENT NO. : 7,327,152 B2  Page 1 of 1
APPLICATION NO. : 10/529340
DATED : February 5, 2008
INVENTOR(S) : Armin Fischer et al.

It is certified that error appears in the above-identified patent and that said Letters Patent is hereby corrected as shown below:

On the Title Page

Item (73), immediately after "Technologies" delete "," (comma).

Signed and Sealed this

Seventeenth Day of June, 2008

JON W. DUDAS
*Director of the United States Patent and Trademark Office*